United States Patent [19]

Przybysz et al.

[11] Patent Number: 5,198,815
[45] Date of Patent: Mar. 30, 1993

[54] TWO LOOP SUPERCONDUCTING SIGMA-DELTA ANALOG-TO-DIGITAL CONVERTERS

[75] Inventors: John X. Przybysz, Penn Hills; Donald L. Miller, Penn Township, Westmoreland County, both of Pa.; Eric H. Naviasky, Baltimore, Md.

[73] Assignee: Westinghouse Electric Corp., Pittsburgh, Pa.

[21] Appl. No.: 807,040

[22] Filed: Dec. 12, 1991

[51] Int. Cl.$^5$ .......................................... H03M 3/00
[52] U.S. Cl. .................................. 341/133; 341/143
[58] Field of Search ............... 341/133, 143, 171, 155; 505/827, 864

[56] References Cited

U.S. PATENT DOCUMENTS

| | | |
|---|---|---|
| 4,315,255 | 2/1982 | Harris et al. ............. 341/133 X |
| 4,983,971 | 1/1991 | Przybysz et al. .......... 341/133 |
| 5,019,818 | 5/1991 | Lee ............................ 341/133 |
| 5,140,324 | 8/1992 | Przybysz et al. .......... 341/133 |

OTHER PUBLICATIONS

James C. Candy, A Use of Double Integration in Sigma Delta Modulation, 1985 IEEE Transactions on Communications, vol. Com 33, No. 3, Mar. 1985, pp. 249–258.

V. K. Kaplunenko et al., Experimental Study of the RSFQ Logic Elements, IEEE, Trans. on Mugn., Vo. MAG-25, pp. 861–864, Mar., 1989.

*Primary Examiner*—Sharon D. Logan
*Attorney, Agent, or Firm*—R. P. Lenart

[57] ABSTRACT

A two-loop superconducting sigma-delta analog-to-digital converter includes a first superconducting inductor to which the analog signal is applied. A resistor converts to current in the first inductor to a voltage which is applied to a second superconducting inductor. The current in the second inductor, which increases quadradically with time, is applied to an overdamped Josephson junction which kicks back a single quantum voltage pulse each time its critical current is exceeded. This pulse reduces the current in the second inductor and serves as a digital ONE output. The pulses are also applied to an underdamped Josephson junction in a feedback pulse generator which latches at its gap voltage for the remainder of a half cycle of an ac bias current. This provides a voltage source for the primary of a superconducting transformer having a mutual inductance which produces sufficient flux in the secondary to cause a SQUID to generate in response to each pulse from the quantizer a selected number of feedback pulses which are applied to the first inductor.

6 Claims, 5 Drawing Sheets

TWO LOOP SUPERCONDUCTING SIGMA-DELTA ANALOG-TO-DIGITAL CONVERTERS

BACKGROUND OF INVENTION

1. Field of Invention

This invention relates to analog-to-digital converters, and more particularly to sigma-delta type analog-to-digital converters implemented with superconducting circuit elements arranged in a two loop configuration.

2. Background Information

Sigma-delta converters are a class of analog-to-digital converters. The basic sigma-delta converter utilizes an integrator to which the analog signal to be converted is applied. A single rough comparator operating at high speed converts the output of the integrator to a single bit digital signal. The comparator is combined with a digital-to-analog converter to form a quantizer. A digital filter converts the high speed single bit output of the quantizer into a multi-bit digital output. The converter also includes a feedback loop including the comparator, the digital-to-analog converter and the integrator. The quantizer samples the integrator output at a rate many times the Nyquist rate. The rate of the multi-bit output signal is a function of the sampling rate and the number of bits in the output signal. The feedback in the sigma-delta converter integrates the error in the least significant bit thereby shifting quantization noise, which limits the dynamic range in conventional analog-to-digital converters, to frequencies above the frequency of the analog input signal. The chief advantage of sigma-delta converters is that they substitute high speed digital signal processing for the high precision analog circuits required in conventional analog-to-digital converters.

The basic sigma-delta converter has a single loop. Higher order converters have additional feedback loops, each with an integrator. A two loop sigma-delta converter has an outer loop which integrates the difference between the analog input signal and the quantizer output and applies the integrated error as the input to the inner loop. Such a two loop converter substantially reduces the sampling rate required for a given resolution of the digital output signal.

Typically, single loop and higher order sigma-delta converters have been implemented in semi-conductor integrated circuits. Such semi-conductor versions are used for example in high performance systems to obtain 18 to 20 bits on the 22 KHz audio band. This is accomplished with megahertz sampling of the analog signal.

Our commonly owned Patent Application Ser. No. 07/710,856 filed on Jun. 6, 1991, now U.S. Pat. No. 5,140,324, discloses a sigma-delta converter implemented with superconducting elements and operating with GHz sampling rates to provide high resolution for megahertz signals. This superconducting sigma-delta converter utilizes a superconducting inductor as the integrator, a Josephson junction as the quantizer and a superconducting Quantum Interference Device (SQUID) to generate GHz rate sampling pulses. When the sum of a sampling pulse and the inductor current generated by the superconducting inductor exceeds a critical current, the Josephson junction generates a voltage pulse which represents a digital "one" output. The voltage pulse also provides feedback to the superconducting inductor. This feedback is very precise and stable as each voltage pulse generated by the Josephson junction is a flux quantum.

Sigma-delta converters having sampling rates in the GHz range are useful in generating high resolution digital signals from high frequency analog signals in applications such as for example surveillance radar, signal interception and medical imaging.

It would be desirable to have a sigma-delta converter operating in the GHz and above sampling range which would require less oversampling and therefore could provide better resolution and/or convert higher frequency analog signals.

SUMMARY OF THE INVENTION

The invention is directed to a two-loop superconducting sigma-delta analog-to-digital converter in which the analog signal to be converted is applied to a first superconducting inductor to produce a first inductor current which increases linearly with time. This first inductor current is converted to a voltage signal which is applied to a second superconducting inductor to produce a second inductor current which increases quadradically with time. The current from the second superconducting inductor is applied to a Josephson junction quantizer which emits a voltage pulse which reduces the second inductor current when current flowing through the Josephson junction quantizer exceeds the critical current of the junction. This forms the inner loop of the two-loop converter. Feedback means in the outer loop generates a selected number of feedback pulses for each pulse generated by the quantizer junction. These feedback pulses reduce the current in the first inductor. The pulse generated by the Josephson junction quantizer is also the digital output which is converted to a multi-bit output signal.

The feedback means comprises a SQUID connected to the secondary winding of a superconducting transformer. A primary current generating means generates a predetermined current in the primary of the superconducting transformer in response to each pulse from the Josephson junction quantizer. The mutual inductance of the superconducting transformer is selected such that the flux generated in the secondary winding is sufficient to cause the SQUID to generate the selected number of feedback pulses.

The primary current generating means includes an underdamped Josephson junction which is biased by an ac current source. The pulse generated by the Josephson junction quantizer adds to the ac bias current flowing through the underdamped Josephson junction to produce a total current in the underdamped Josephson junction which exceeds the critical current of the junction. This causes the underdamped Josephson junction to latch in a voltage mode at a predetermined gap voltage for the remainder of the half cycle of the ac bias current. This in turn provides a source of current for the primary winding of the superconducting transformer. A resistor in series with the primary winding sets the value of the predetermined primary current.

The SQUID in the feedback means comprises two Josephson junctions: one connected in series with the first inductor and across the secondary of the superconducting transformer, and the second in series with the secondary of the superconducting transformer. The polarity of the secondary winding is such that the current produced in the secondary by a pulse from the quantizer adds to the current from the first inductor flowing through the first junction of the SQUID causing the first junction to generate the predetermined number of feedback pulses which reduces the current in the inductor. The second junction in the SQUID produces the selected number of pulses when the underdamped junction is reset as the ac bias current goes through zero.

The exemplary converter is synchronized by a sampling pulse generator which provides pulses which add to the current from the second inductor flowing through the Josephson junction quantizer to establish bits for the digital signal. The single bit digital signal generated by the quantizer is converted to a multi-bit signal by a digital filter.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
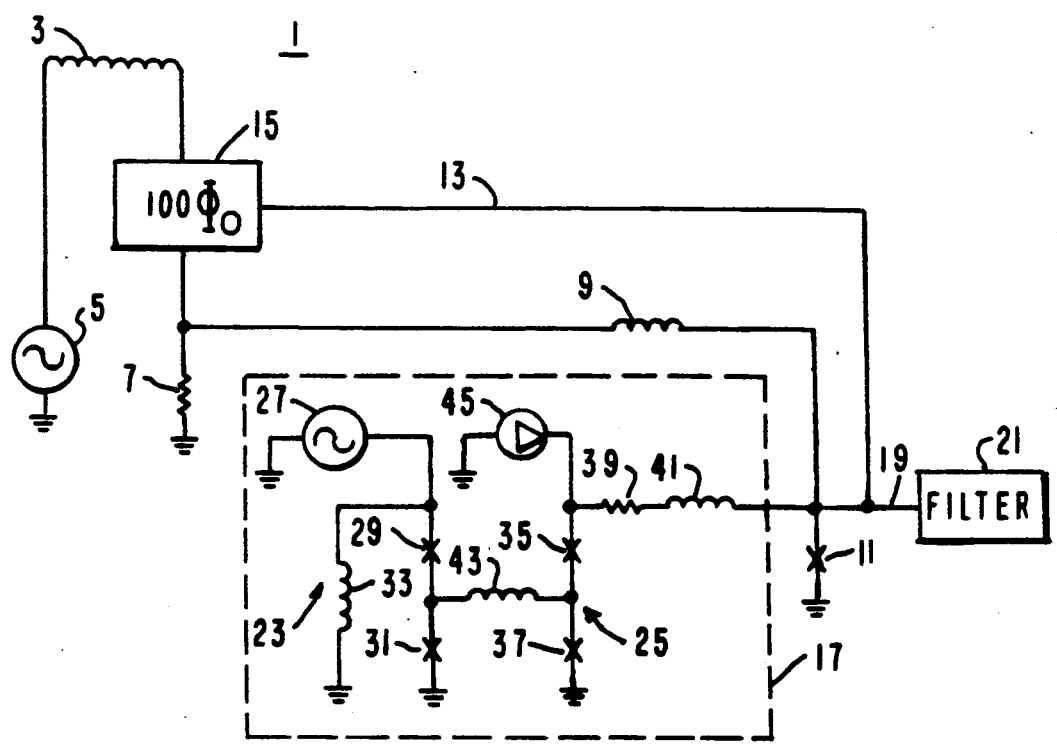
FIG. 1 is a circuit diagram of a two-loop superconducting sigma-delta analog digital converter in accordance with the invention.

FIG. 1 illustrates a two-loop superconducting sigma-delta analog-to-digital converter in accordance with the invention. The converter 1 includes a first superconducting inductor 3 to which the analog voltage to be converted, such as a voltage produced by the source 5, is applied. Current increases linearly in the first inductor 3 as the time integral of the applied signal. The first inductor current acts upon a low value resistor 7 to produce a voltage source for a second superconducting inductor 9. Current flowing in the second inductor 9 increases quadradically in time. Current from the second superconducting inductor 9 flows through a Josephson junction 11 to ground. The Josephson junction 11 acts as a comparator. When the current through a Josephson junction 11 exceeds the critical current of the junction, it goes into a voltage state momentarily. This back voltage drops the current in the inductor 9 below the critical current of the junction 11 and an output voltage pulse will be produced, indicating a digital ONE. The junction 11 and second inductor 9 form the inner loop of the two-loop converter. An outer loop is formed by the lead 13 and the feedback pulse generator 15. As will be described, the pulse generator 15 generates multiple pulses from the pulse generated by the Josephson junction 11. The multiple pulses generated by the pulse generator 15 reduce the current in the first inductor 3.

The voltage pulse produced by the Josephson junction 11 is the size of a flux quantum (h/2e), where h is Planck's constant and e is the electron charge, and is thus, very precise. As will be described below, each of the multiple voltage pulses produced by the pulse generator 15 are also the size of a flux quantum.

In the converter 1 of FIG. 1, the pulses generated by the Josephson junction 11 are synchronized by a sampling pulse generator 17. Sampling pulses generated by the pulse generator 17 add to the current from the second inductor 9 flowing through the Josephson junction 11. On pulses for which the total current through the junction 11 exceeds the Josephson junction critical level, the junction will emit a voltage pulse which produces a digital ONE on the output line 19. On sampling pulses for which the total current through the junction 11 does not exceed the junction critical voltage, a ZERO output appears on the output lead 19. Thus, the sampling circuit 17 provides clock pulses which define the bits of the digital output signal.

The signal appearing on the output 19 is a single bit digital signal at the clock rate of the sampling circuit 17. A digital filter 21 converts this single bit high-frequency signal into a multi-bit digital signal, preferably at the Nyquist rate. Suitable digital filters are disclosed in the above reference U.S. Pat. application Ser. No. 07/710,856 filed on Jun. 6, 1991, now U.S. Pat. No. 5,140,324, which is hereby incorporated by reference. The number of bits in the multi-bit output signal generated by the filter 21 depends upon the oversampling rate of the pulses generated by the sampling pulse generator 17. For converters in accordance with the invention, the sampling pulse rate can be in the GHz range. Thus, megahertz analog signals can be converted to 20 bit digital signals using a one GHz sampling rate.

The sampling pulse generator 17 is a known circuit. It comprises a two-junction, superconducting, quantum interference device (SQUID) 23 and a pulse buffer 25. The SQUID 23 includes a current source 27 feeding a pair of series-connected Josephson junctions 29 and 31 which are shunted by a superconductor inductor 33. In this known SQUID arrangement, the junction 31 generates a train of clock pulses. The pulse buffer 25 sharpens these clock pulses and protects the SQUID 23 from the kick-back pulses from the quantizer junction 11. The pulse buffer 25 includes a pair of Josephson junctions 35 and 37 connected through a resistor 39 and inductance 41 to the quantizer junction 11.

The pulse generated by the SQUID 23 is applied through the superconducting coupling inductor 43 to the Josephson junction 37 which generates a sharp voltage pulse. This voltage pulse passes through the junction 35, resistor 39 and inductance 41 to the quantizer Josephson junction 11. A dc bias source 45 provides some bias current to the junction 37 to assure its responce to the voltage pulse from the SQUID 23. The resistor 39 prevents the flow of circulating currents. The buffer 25 not only sharpens the pulses generated by the SQUID, but also prevents kick-back from the quantizer Josephson junction 11 in the SQUID pulser 23.

The key to the operation of a second order converter such as shown in FIG. 1 is large digital feedback. In the exemplary converter 1 of FIG. 1, the feedback pulse generator 15 generates 100 flux quantum pulses for each pulse generated by the quantizer Josephson junction 11.

Figure 2:
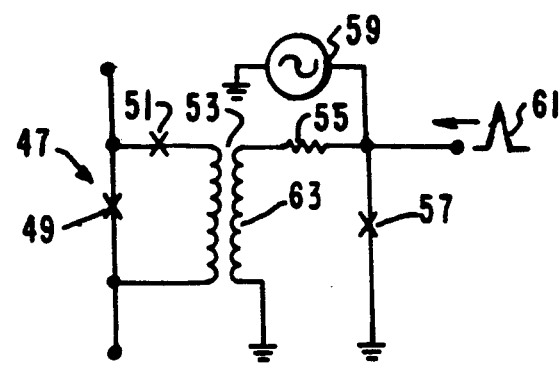
FIG. 2 is a schematic circuit diagram of a pulse multiplier which forms a part of the two-loop sigma-delta analog-to-digital converter of FIG. 1.

FIG. 2 illustrates a circuit for generating these multiple feedback pulses from the quantizer pulse. The circuit 15 includes a SQUID 47 having two Josephson junctions 49 and 51. The SQUID 47 is coupled through a superconducting transformer 53 and a resistor 55 to an underdamped Josephson junction 57. Junction 57 is biased by an ac current source 59 which would normally be a sine wave, but could also be a clipped sine wave or a square wave. The kickback pulse 61 generated by the quantizer junction 11 is applied to the underdamped Josephson junction 57 causing the junction 57 to latch on the ac bias at the gap voltage of the junction, thereby providing a voltage source to the series combination of the resistor 55 and inductor formed by the primary 63 of the superconducting transformer 53. The gap voltage of the junction 57 depends upon the material from which it is made. For example, a niobium junction has a gap voltage of 2.8 mv at 4.2 K.

The ac current source 59 in the pulse generator circuit 15 is synchronized to the sampling pulses generated by the sampling pulse generator 17 so that a sampling pulse occurs on the leading edge of the pulse generated by the source 59. The combination of the resistor 55 and the input inductor 63 acts as a low pass filter so that the transformer 63 acts as a low pass filter so that the transformer 53 responds to the average voltage on junction 57. The mutual inductance M of the superconducting transformer 53 is selected so that M times the input current produces a flux in the secondary winding 65 of the transformer 63 which is at least 100 flux quanta (2/eh 32 2 $\times 10^{15}$ A-henrys) but less than 101 flux quanta. This produces a current in the secondary which adds to the current from inductor 3 flowing through the junction 49 causing the junction 49 to pulse 100 times. These 100 pulses reduce the current in the first inductor 3. When the ac bias current generated by the source 59 falls through zero, the input current through the resistor 55 and inductor 33 resets to zero and the junction 51 pulses 100 times. This set of 100 pulses prevents currents in inductor 3 from flowing through the junction 51 and the inductor 53.

Thus, the feedback pulse generating circuit 15 feeds back 100 pulses to the first inductor 3 during the positive half cycle of the ac bias generated by the source 59 each time it is triggered by an input pulse 61 from the quantizer Josephson junction 11. The frequency of the source 59 is between about one and 100 GHz while the width of the feedback pulse 61 is about 1 to 6 picoseconds.

Figure 3:
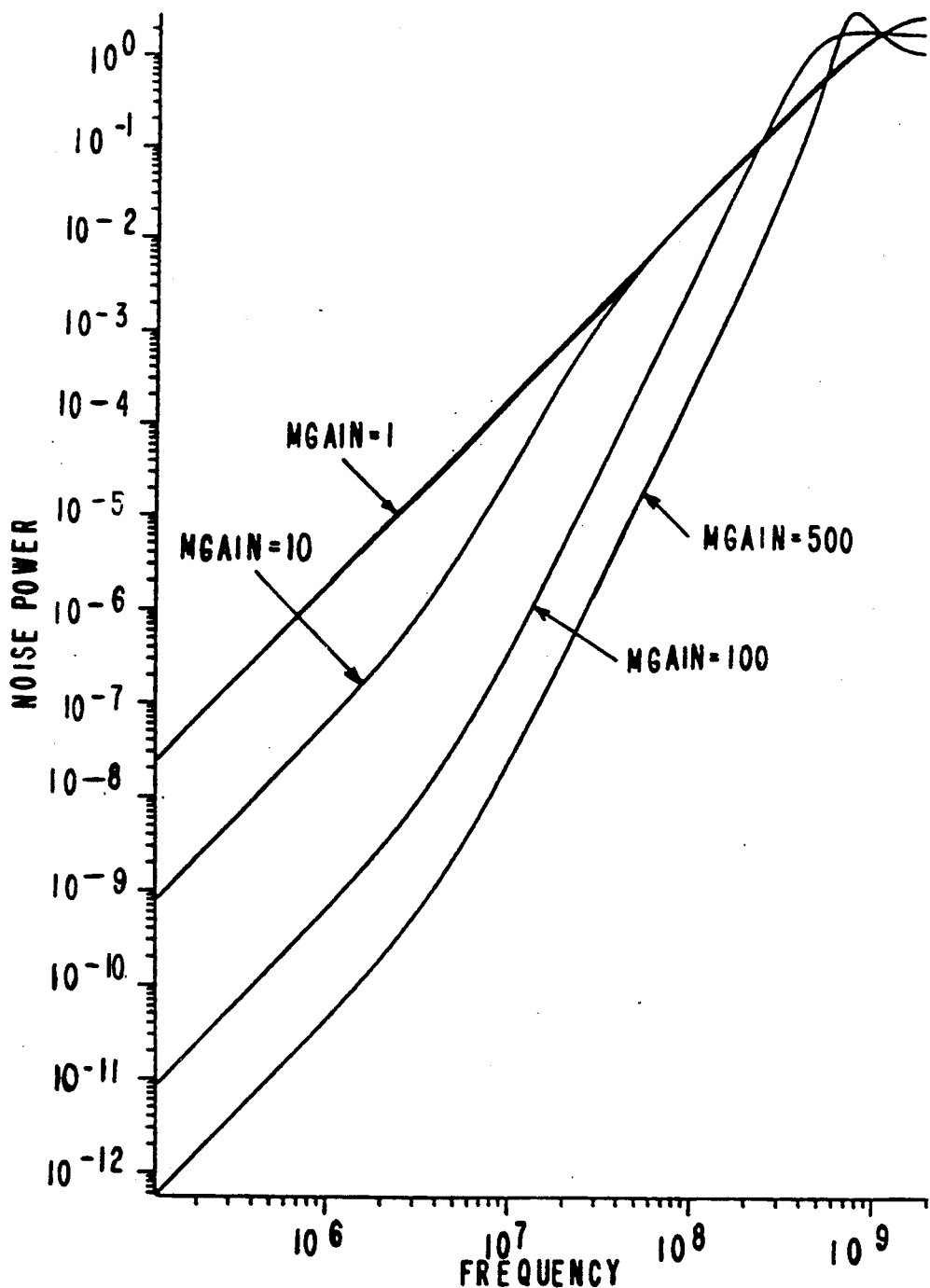
FIG. 3 is a plot of the quantization noise transfer function computed for a two-loop converter in accordance with the invention.

The filter transfer function for the two-loop converter shown in FIG. 1 is as follows:

$$\left[ 1 + Z^{-1}\left( \frac{RT}{L_2} + \frac{RT}{L_1} - 1 \right) + Z^{-2}\left( \frac{MRT}{L_1} - \frac{RT}{L_2} \right) \right] Y = Z^{-1} \frac{RT^2}{L_1 L_2} X + \left[ 1 + Z^{-1}\left( 2 - \frac{RT}{L_2} - \frac{RT}{L_1} \right) + Z^{-2}\left( 1 - \frac{RT}{L_2} - \frac{RT}{L_1} \right) \right] E$$

where:
- $L_1$ = inductance of outer loop inductor 3
- R = resistance of transfer resistor 7
- $L_2$ = inductance of inner loop inductor 9
- M = number of pulses generated by feedback pulse generator 15
- X = input voltage
- Y = output digits
- E = quantization error
- Z = time delay operator The quantization noise transfer function computed for the two-loop modulator is shown in FIG. 3 for several values of M. The outer and inner loop inductances $L_1$ and $L_2$ were each 100 pH and the resistance R was 0.0015 ohm. As can be seen from FIG. 3, the quantization noise was M =1 falls off at the rate of 9 dB/octave of oversampling. This is typical of single loop performance. For values of M greater than one, there is a region of frequency for which the quantization noise is reduced by 15 dB/octave, which is the usual result for double loop modulators. Thus, the use of multiple pulses in the feedback to the outer loop greatly suppresses in-band quantization noise.

Figure 4:
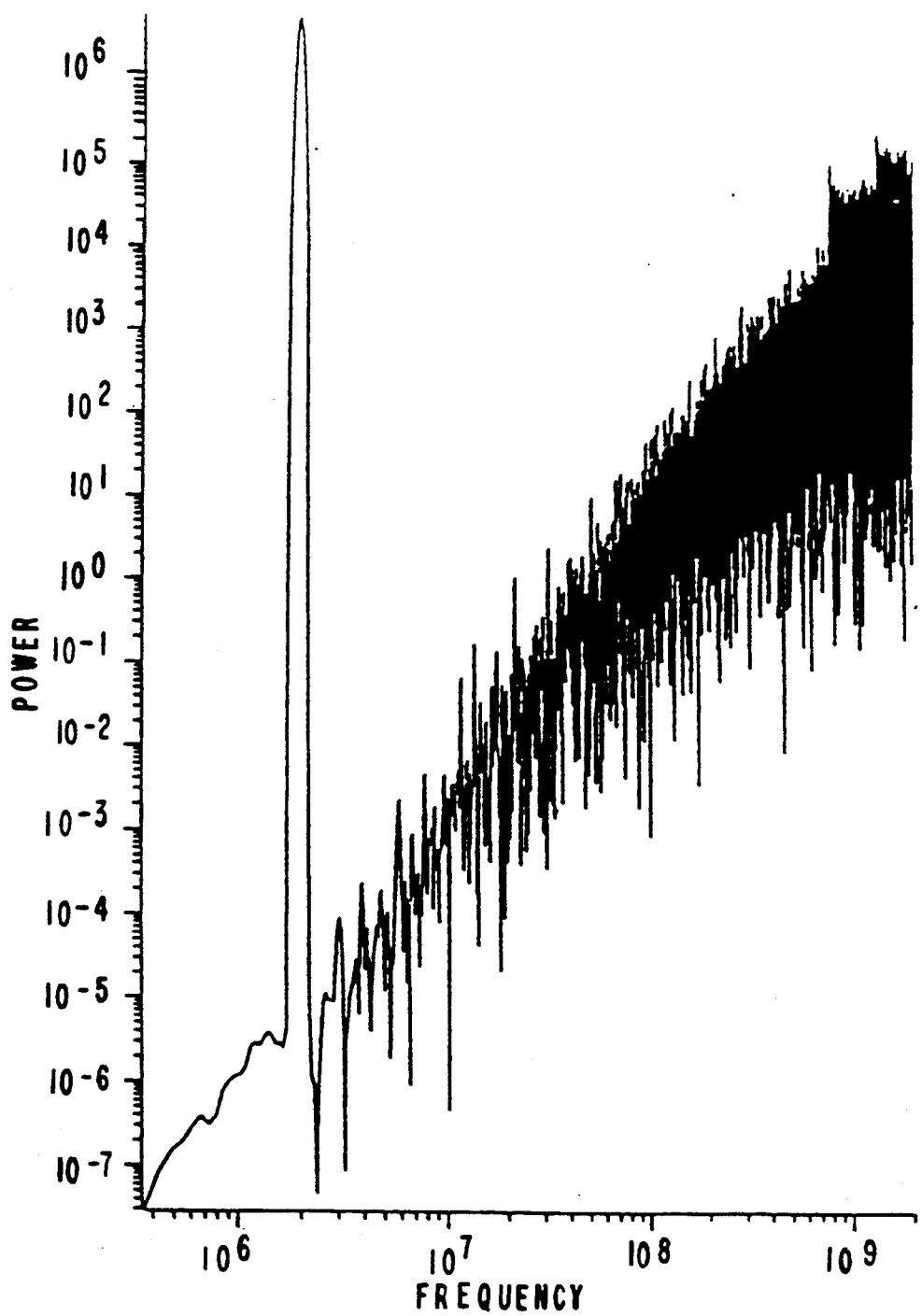
FIG. 4 is plot of the power spectrum of the two-loop converter in accordance with the invention.

A model-based calculation was used to estimate the performance of a manufacturable modulator. The program calculated inductor current in the step-wise fashion, using 250 psec time increments, i.e., it simulated a 4 GHz sampling rate. Whenever the current of the inductor 9 exceeded the 100 $\mu$A critical current of the junction 11 both loop currents were reduced by the appropriate feedback. A fast Fourier transform of the output ones and zeros is shown in FIG. 4. The pure tone 1.95 MHz input was spread in FIG. 4 by using a $\sin^6$ windowing function.

Figure 5:
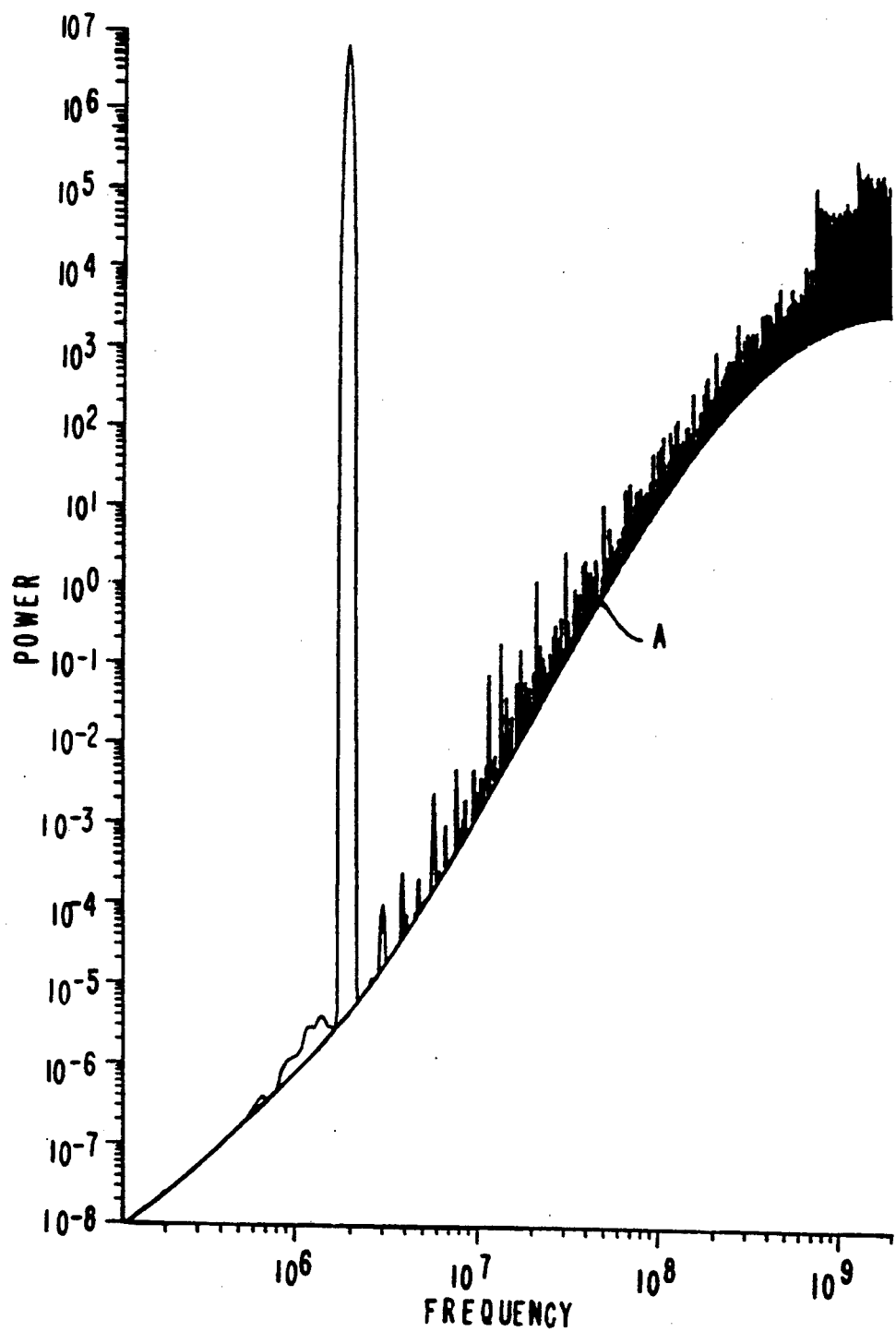
FIG. 5 illustrates a fit of the noise transfer function of FIG. 3 to the calculated power spectrum of FIG. 4.

To verify the correctness of the noise transfer function equation, the noise power spectrum was computed for the circuit parameters used on the model calculation. The fit to the simulation result is shown in FIG. 5 where A is the noise transfer function. The frequency dependence of the noise power was well predicted by the noise transfer equation.

The effect of thermal noise on circuit performance was also calculated. Previous modeling of single loop superconducting modulators showed that the biggest problem is incorrect triggering of the output junction 11 due to Johnson noise in its shunting resistor. For niobium junctions of the manufacturable technology (4 KA/cm$^2$), shunting resistor of 6 ohms is appropriate for a 100 $\mu$A junction 11. The noise bandwidth is set by the Josephson plasma frequency — the highest frequency to which a junction can track an ac current source — 100 GHz in this calculation.

Figure 6:
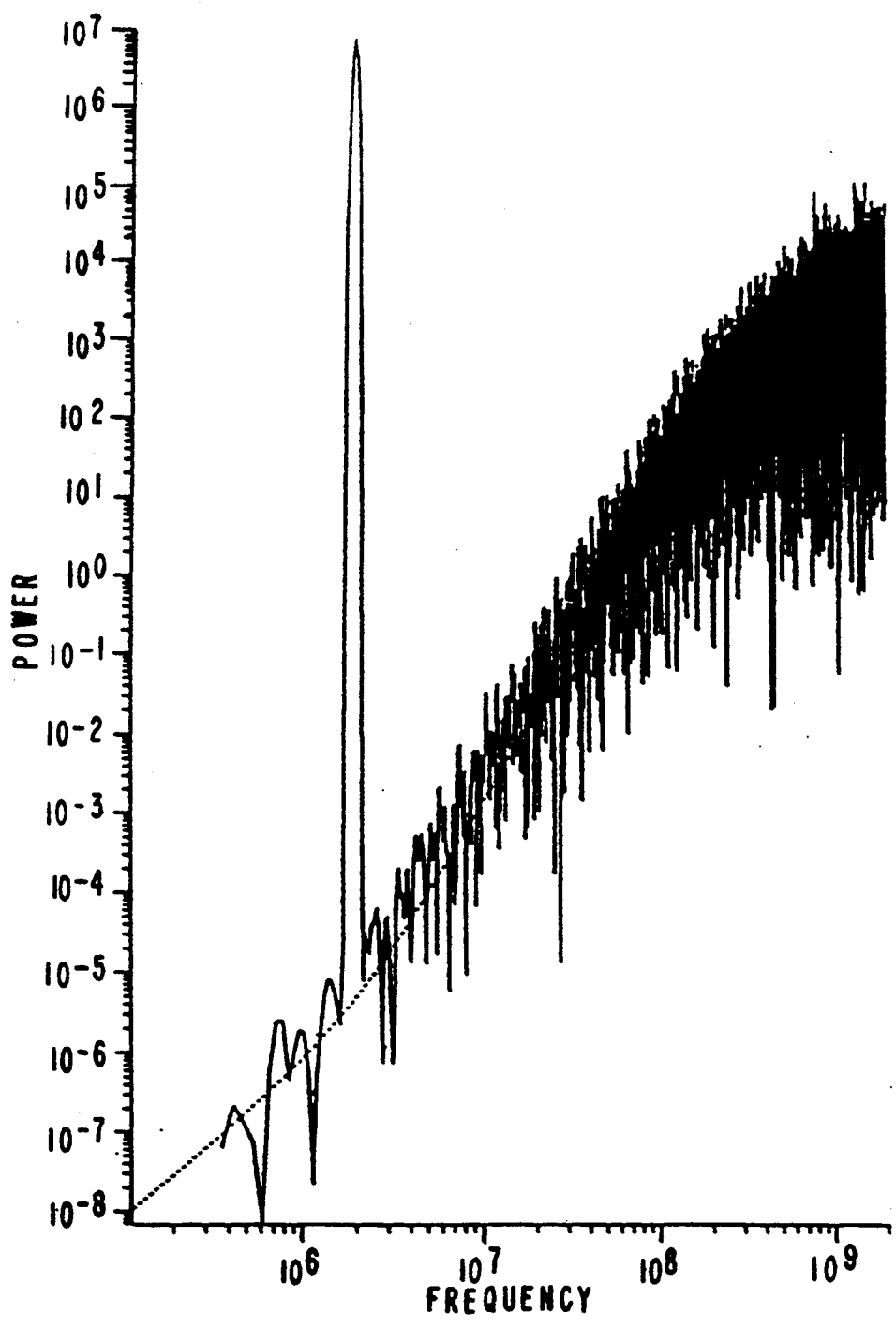
FIG. 6 is a plot of the response of the two-loop converter of the invention in the presence of thermal noise.

Gaussian random current noise of RMS value 2 $\mu$A was added to the current in inductor 9 at each sampling time. This could advance or retard the occurrence of a modulator ONE, due to the random current noise. The power spectrum of the calculation is shown in FIG. 6. The dotted line shows the result of the calculation for noise-free simulation of FIG. 5. The total signal to noise for the 300 KHz to 2 MHz band is 113 dB, despite the errors caused by thermal noise. This corresponds to a dynamic range of 18 bits.

In summary, a new modulator circuit has been found that is useful for A/D conversion or megahertz signals to accuracies of 18 bits or more with sampling rates of 4 GHz. This is impossible because superconducting electronics can both sample and provide uniform, repeatable feedback pulses at GHz rates.

While specific embodiments of the invention have been described in detail, it will be appreciated by those skilled in the art that varies modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A two-loop superconducting sigma-delta analog-to-digital converter for converting an analog input signal to a digital output signal, said converter comprising:

a first superconducting inductor to which said analog input signal is applied to produce a first inductor current;

means converting said first inductor current to a voltage signal;

a second superconducting inductor to which said voltage signal is applied to produce a second inductor current;

a Josephson junction quantizer connected to said second superconducting inductor and through which said second inductor current flows, said Josephson junction quantizer emitting a voltage pulse which reduces said second inductor current when current flowing through said Josephson junction quantizer exceeds a critical current of the Josephson junction quantizer;

feedback means connected to said Josephson junction quantizer and feeding back to said first inductor selected multiple feedback pulses for each voltage pulse generated by said Josephson junction quantizer; and means generating said digital output signal from said voltage pulse generated by said Josephson junction quantizer.

2. The converter of claim 1 wherein said means generating said digital output signal comprises timing means defining bits of said digital output signal, which bits are set to a digital ONE in the presence of said voltage pulse and to a digital ZERO in the absence of said voltage pulse, and means generating a multi-bit output signal from said bits defined by said timing means.

3. The converter of claim 2 wherein said timing means comprises sampling pulse generating means which repetitively generates sampling current pulses which add to the inductor current flowing through the Josephson junction quantizer to produce a total current through said Josephson junction quantizer, said Josephson junction quantizer emitting a voltage pulse when said total current exceeds said critical current.

4. The converter of claim 1 wherein said feedback means comprises a SQUID, a superconducting transformer having a primary winding a secondary winding, and a selected mutual inductance M, means connecting said secondary winding to said SQUID, and primary current generating means generating a predetermined primary current in said primary winding in said superconducting transformer in response to said voltage pulse generated by said Josephson junction quantizer, said mutual inductance M being selected so that M times said predetermined primary current generates in said secondary winding a flux sufficient to cause said SQUID to generate said selected multiple feedback pulses.

5. The conveyor of claim 4 wherein said primary current generating means comprises:

an underdamped Josephson junction having a critical current;

an ac current source supplying an ac bias current to said underdamped Josephson junction;

means applying said voltage pulse generated by said Josephson junction quantizer to said underdamped Josephson junction to produce, together with a half-cycle of said ac bias current, a total current in said underdamped Josephson junction which exceeds said critical current of said underdamped Josephson junction to latch said underdamped Josephson junction in a voltage mode at a predetermined gap voltage for a remainder of said half cycle of said ac bias current; and a resistor connected between said underdamped Josephson junction and said primary winding of said superconducting transformer and having a value which produces from said gap voltage said predetermined primary current.

6. The converter of claim 4 wherein said SQUID comprises first and second Josephson junctions, with said first Josephson junction connected in series between said first superconducting inductor and said means converting said first conductor current to a voltage signal and across the secondary winding of said superconducting transformer, and said second Josephson junction being connected in a loop with said secondary winding of said superconducting transformer.

* * * * *